US010639746B1

(12) United States Patent
Nashner et al.

(10) Patent No.: US 10,639,746 B1
(45) Date of Patent: May 5, 2020

(54) CERAMIC-BASED COMPONENTS HAVING LASER-ETCHED MARKINGS

(71) Applicant: Apple Inc., Cupertino, CA (US)

(72) Inventors: Michael S. Nashner, Cupertino, CA (US); Peter N. Russell-Clarke, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/630,230

(22) Filed: Feb. 24, 2015

Related U.S. Application Data

(60) Provisional application No. 62/015,098, filed on Jun. 20, 2014.

(51) Int. Cl.
| | | |
|---|---|---|
| *B23K 26/354* | (2014.01) | |
| *B23K 26/40* | (2014.01) | |
| *B23K 26/36* | (2014.01) | |
| *H05K 5/02* | (2006.01) | |

(52) U.S. Cl.
CPC .......... *B23K 26/408* (2013.01); *B23K 26/354* (2015.10); *B23K 26/365* (2013.01); *H05K 5/0252* (2013.01)

(58) Field of Classification Search
CPC ............ B23K 26/0006; B23K 26/0063; B23K 26/0066; B23K 26/0081; B23K 26/352; B23K 26/354; B23K 26/36; B23K 26/362; B23K 26/364; Y10T 428/24479; Y10T 428/24521; Y10T 428/24545
USPC .......................... 428/156, 161, 164, 172, 173
See application file for complete search history.

(56) References Cited

U.S. PATENT DOCUMENTS

| | | | |
|---|---|---|---|
| 2,942,383 | A | 6/1960 | Brown et al. |
| 3,091,060 | A | 5/1963 | Giegerich et al. |
| 3,094,814 | A | 6/1963 | Barke et al. |
| 3,131,515 | A | 5/1964 | Mason |
| 3,453,097 | A | 7/1969 | Hafner |
| 3,535,159 | A | 10/1970 | Shiro |

(Continued)

FOREIGN PATENT DOCUMENTS

| | | |
|---|---|---|
| CN | 1976778 | 6/2007 |
| CN | 1978167 | 6/2007 |

(Continued)

*Primary Examiner* — Megha M Gaitonde
(74) *Attorney, Agent, or Firm* — Brownstein Hyatt Farber Schreck, LLP

(57) ABSTRACT

A ceramic-based component including laser-etched markings, an electronic device including a ceramic-based component, and methods of forming the same. The ceramic-based component may include an outer surface, and a laser-etched marking formed on the outer surface. The laser-etched marking may include a recess having a substantially uneven surface formed in the outer surface. The recess may have a material composition distinct from a material composition of the outer surface. The method of forming the ceramic-based component may include laser etching an outer surface of a ceramic-based component, and in response to the laser etching, forming a laser-etched marking on the outer surface of the ceramic-based component. The method may also include altering the optically reflective properties of the laser-etched marking and/or altering a material composition of the laser-etched marking relative to a distinct material composition of the outer surface of the ceramic-based component.

20 Claims, 7 Drawing Sheets

(56) References Cited

U.S. PATENT DOCUMENTS

| | | | |
|---|---|---|---|
| 3,699,719 A | 10/1972 | Rozdilsky et al. | |
| 3,848,363 A | 11/1974 | Lovness et al. | |
| 3,855,441 A | 12/1974 | Kimmelmann | |
| 3,885,943 A | 5/1975 | Chui | |
| 4,122,602 A | 10/1978 | Sastri et al. | |
| 4,343,111 A | 8/1982 | Inoue | |
| 4,467,168 A | 8/1984 | Morgan | |
| 4,524,543 A | 6/1985 | Inoue | |
| 4,682,003 A | 7/1987 | Minakawa | |
| 4,806,731 A * | 2/1989 | Bragard | B21B 27/005 219/121.68 |
| 4,861,620 A * | 8/1989 | Azuma | B41M 5/28 347/232 |
| 5,185,957 A | 2/1993 | Mizuguchi et al. | |
| 5,187,899 A | 2/1993 | Rhoades | |
| 5,230,182 A | 7/1993 | Daniell et al. | |
| 5,303,510 A | 4/1994 | Calkins | |
| 5,384,989 A | 1/1995 | Shibano | |
| 5,404,680 A | 4/1995 | Mizuguchi et al. | |
| 5,776,355 A * | 7/1998 | Martin | B23B 27/146 216/52 |
| 5,836,249 A * | 11/1998 | Chatterjee | B41C 1/1033 101/467 |
| 5,857,901 A | 1/1999 | LaPoint | |
| 5,957,753 A | 9/1999 | Komanduri et al. | |
| 6,198,070 B1 | 3/2001 | Nakayama et al. | |
| 6,376,797 B1 | 4/2002 | Piwczyk et al. | |
| 6,413,619 B1 * | 7/2002 | Hamada | C03C 4/02 106/31.05 |
| 6,562,698 B2 | 5/2003 | Manor | |
| 6,580,054 B1 | 6/2003 | Liu et al. | |
| 6,612,906 B2 | 9/2003 | Benderly | |
| 6,746,724 B1 * | 6/2004 | Robertson | B05D 5/06 219/121.69 |
| 6,899,798 B2 | 5/2005 | Weldon et al. | |
| 7,512,297 B2 | 3/2009 | Farah | |
| 7,514,291 B2 | 4/2009 | Akram | |
| 7,664,469 B2 | 2/2010 | Hutchison | |
| 7,741,579 B2 | 6/2010 | Lambert et al. | |
| 7,803,451 B2 | 9/2010 | Lee et al. | |
| 7,838,796 B2 | 11/2010 | Furui | |
| 7,966,785 B2 | 6/2011 | Zadesky et al. | |
| 8,016,644 B2 | 9/2011 | Curodeau et al. | |
| 8,408,972 B2 | 4/2013 | Kenney | |
| 9,120,179 B2 | 9/2015 | Richter et al. | |
| 9,844,833 B2 | 12/2017 | Li et al. | |
| 2002/0063361 A1 * | 5/2002 | Fahey | B23K 26/0624 264/400 |
| 2003/0006217 A1 * | 1/2003 | Dance | B23K 15/08 219/121.18 |
| 2005/0202681 A1 * | 9/2005 | Nelson | C23C 4/18 438/758 |
| 2007/0132153 A1 | 6/2007 | Aiyer et al. | |
| 2007/0284785 A1 | 12/2007 | Hoekstra | |
| 2009/0275157 A1 | 11/2009 | Winberg et al. | |
| 2009/0275266 A1 | 11/2009 | Winberg et al. | |
| 2011/0003535 A1 | 1/2011 | Perez-Duarte | |
| 2012/0328905 A1 * | 12/2012 | Guo | B23K 26/0084 428/687 |
| 2017/0087687 A1 | 3/2017 | Kamireddi et al. | |

FOREIGN PATENT DOCUMENTS

| | | |
|---|---|---|
| JP | 2001210905 | 8/2001 |
| JP | 2010239157 | 10/2010 |
| TW | 422751 | 2/2001 |
| TW | M438642 | 10/2012 |
| WO | WO2006038152 | 4/2006 |
| WO | WO2011037167 | 3/2011 |

* cited by examiner

CERAMIC-BASED COMPONENTS HAVING LASER-ETCHED MARKINGS

CROSS-REFERENCE TO RELATED APPLICATION

This application is a nonprovisional patent application and claims the benefit of U.S. Provisional Patent Application No. 62/015,098, filed Jun. 20, 2014 and titled "Ceramic-Based Components Having Laser Etched Markings," the disclosure of which is hereby incorporated herein in its entirety.

TECHNICAL FIELD

The disclosure relates generally to a component for an electronic device, and more particularly, to a ceramic-based component including laser-etched markings, and methods of forming the ceramic-based component including laser-etched markings.

BACKGROUND

Conventional electronic devices typically include housings made from durable materials to protect the electronic device. It is desired to form these housings from materials that may withstand the everyday wear-and-tear applied to the electronic device. That is, the housing may be formed from a material that may withstand constant handling of the electronic device by a user, the transportation and/or packing of the electronic devices and undesired blunt forces (e.g., dropping, sitting on) applied to the electronic device during use. In conventional electronic devices, the housing may be formed from metals (e.g., aluminum), reinforced glass, and/or polymers (e.g., plastic, rubber).

Ceramic-based materials are typically not used to form housings for electronic devices. As a result of the physical and/or chemical properties of ceramic-based materials, certain manufacturing processes used to form an electronic device housing may be difficult and/or expensive to perform on ceramic-based material. For example, housings for electronic devices typically include designs, text or logos formed right on or in the material forming the housing. The designs, text or logos may be painted directly on a surface of the housing, or an etch may first be made on the surface, and then the etch may be subsequently painted.

When painting the designs on a ceramic-based material, the finished painted component needs to be "fired" or heated, to set the paint into the material. The process of heating the entire component formed from the ceramic-based material may substantially alter and/or undesirably change the physical and/or chemical properties of the ceramic-based material. In addition, the process of painting a design on a surface of a component formed from any material, ceramic-based or not, may require additional processing, such as, the application of a protective coating to avoid chipping or wearing away of the paint. The application of the protective coating over the painted surface may increase manufacturing time and/or cost of producing an electronic device housing.

With respect to etching ceramic-based material, conventional etching processes performed on the surface of ceramic-based material may be difficult and/or expensive to complete, because of the physical and/or chemical properties of the ceramic-based material. More specifically, due to the hardness, elasticity, fracture toughness and/or ductility of ceramic-based materials, conventional etching processes may produce insufficient or undesirable results when forming the designs on the surface of the ceramic-based materials. For example, the etch formed in the ceramic-based material using conventional etching processes may be substantially minimal or negligible, such that the etch may not be deep enough in the surface to be adequately painted. Where the etch is not capable of being painted due to the inadequate depth of the etch, the paint applied to the surface etch, protected by a protective coating or not, may wear off or fade over the life of the electronic device.

SUMMARY

Generally, embodiments discussed herein are related to a ceramic-based component including laser-etched markings, an electronic device including a ceramic-based component, and methods of forming the ceramic-based component including laser-etched markings. Ceramic-based components for an electronic device may include a laser-etched marking formed on an outer surface of the ceramic-based component. The process of laser etching the marking on the outer surface of the ceramic-based component may result in the formation of a recess in the ceramic-based component and, a contrast in colors between the outer surface and the laser-etched marking or recess. More specifically, the process of ablating and melting a portion of the ceramic-based component during a laser etching process may result in a color contrast, or other optical contrast, between the laser-etched portion (e.g., marking or recess) and the unaffected, outer surface of the ceramic-based component. The color/optical contrast may be formed as a result of the way light interacts with and/or reflects from the outer surface of the ceramic-based component, in contrast to the uneven, laser-etched marking or recess formed in the ceramic-based component. By forming a color contrast between the outer surface and the marking or recess formed on the surface of the ceramic-based component, the need for painting a design, text or logo on the component may be unnecessary. As such, the manufacturing time and/or cost of forming a ceramic-based component for an electronic device may be reduced. Furthermore, the marking formed on the surface of the ceramic-based component may be substantially permanent, and may not wear off, distort and/or fade over the life of the electronic device.

One embodiment may include a ceramic-based component. The ceramic-based component may include an outer surface, and a laser-etched marking formed on the outer surface. The laser-etched marking may comprise a recess having a substantially uneven surface formed in the outer surface. The recess may include a material composition distinct from a material composition of the outer surface.

Another embodiment may include an electronic device. The electronic device may include a housing having at least one outer surface. The electronic device may also include a laser-etched marking formed in the outer surface of the housing. The marking may comprise a material composition distinct from a material composition of the outer surface. Additionally, the electronic device may include a heat affected region positioned adjacent to the laser-etched marking. The heat affected region may be positioned below the outer surface of the housing.

A further embodiment may include a method of forming a ceramic-based component. The method may include laser etching an outer surface of a ceramic-based component, and in response to the laser etching, forming a laser-etched marking on the outer surface of the ceramic-based component. The method may also include altering the optically reflective properties of the laser-etched marking and/or altering a material composition of the laser-etched marking relative to a distinct material composition of the outer surface of the ceramic-based component.

BRIEF DESCRIPTION OF THE DRAWINGS

The disclosure will be readily understood by the following detailed description in conjunction with the accompanying drawings, wherein like reference numerals designate like structural elements, and in which.

Figure 1A:
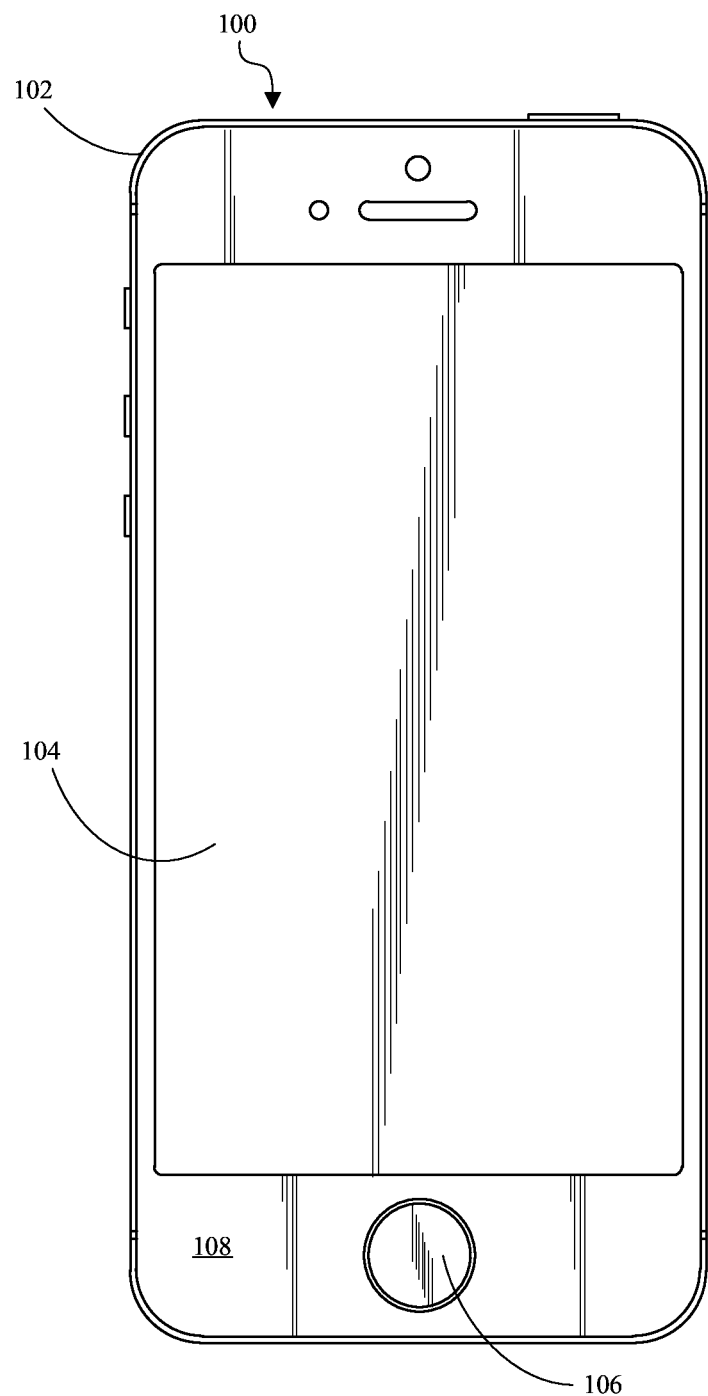
FIG. 1A depicts a front view of an electronic device including a ceramic-based housing, according to embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates generally to a component for an electronic device, and more particularly, to a ceramic-based component including laser-etched markings, and methods of forming the ceramic-based component including laser-etched markings.

The ceramic-based component for an electronic device may include a laser-etched marking formed on an outer surface of the ceramic-based component. The process of laser etching the marking on the outer surface of the ceramic-based component may result in the formation of a recess in the ceramic-based component and, a contrast in colors between the outer surface and the laser-etched marking or recess. More specifically, the process of ablating and melting a portion of the ceramic-based component during a laser etching process may result in a color/optical contrast between the laser-etched portion (e.g., marking or recess) and the unaffected, outer surface of the ceramic-based component. The color/optical contrast may be formed as a result of the way light interacts with and/or reflects from the outer surface of the ceramic-based component, in contrast to the uneven, laser-etched marking or recess formed in the ceramic-based component. By forming a color contrast between the outer surface and the marking or recess formed on the surface of the ceramic-based component, the need for painting a design, text or logo on the component may be unnecessary. As such, the manufacturing time and/or cost of forming a ceramic-based component for an electronic device may be reduced. Furthermore, the marking formed on the surface of the ceramic-based component may be substantially permanent, and may not wear off, distort and/or fade over the life of the electronic device.

These and other embodiments are discussed below with reference to FIGS. 1A-6. However, those skilled in the art will readily appreciate that the detailed description given herein with respect to these Figures is for explanatory purposes only and should not be construed as limiting.

FIG. 1A depicts an illustrative front view of one example of an electronic device 100, according to embodiments. In the illustrated embodiment, electronic device 100 is implemented as a smart telephone. Other embodiments can implement electronic device 100 differently, such as, for example, as a laptop or desktop computer, a tablet computing device, a gaming device, a display, a digital music player, a wearable computing device or display, a health monitoring device, and so on.

Electronic device 100 includes a housing 102 at least partially surrounding a display 104 and one or more buttons 106 or input devices. More specifically, as shown in FIG. 1A, electronic device 100 may include display 104 and button 106 formed on an outer surface 108 of housing 102. Housing 102 can form outer surface 108 or partial outer surface 108 and protective case for the internal components of the electronic device 100, and may at least partially surround display 104. As discussed herein, outer surface 108 of housing 102 may include a substantially polished outer surface for housing 102. Outer surface 108 may be polished using any suitable polishing technique for a component (e.g., housing 102) formed from a ceramic-based material.

Housing 102 can be formed of one or more components operably connected together, such as a front piece and a back piece. Alternatively, housing 102 can be formed of a single piece operably connected to display 104. As discussed herein, housing 102 may be formed from a ceramic-based material including, but not limited to: zirconium dioxide ($ZrO_2$), commonly referred to as zirconia, and zirconia alumina ($ZrO_2Al_2O_3$), commonly referred to as zirconia toughened alumina (ZTA).

Display 104 can be implemented with any suitable technology, including, but not limited to, a multi-touch sensing touchscreen that uses liquid crystal display (LCD) technology, light emitting diode (LED) technology, organic light-emitting display (OLED) technology, organic electroluminescence (OEL) technology, or another type of display technology. Button 106 can take the form of a home button, which may be a mechanical button, a soft button (e.g., a button that does not physically move but still accepts inputs), an icon or image on a display, and so on. Further, in some embodiments, button 106 can be integrated as part of a cover glass of electronic device 100.

Figure 1B:
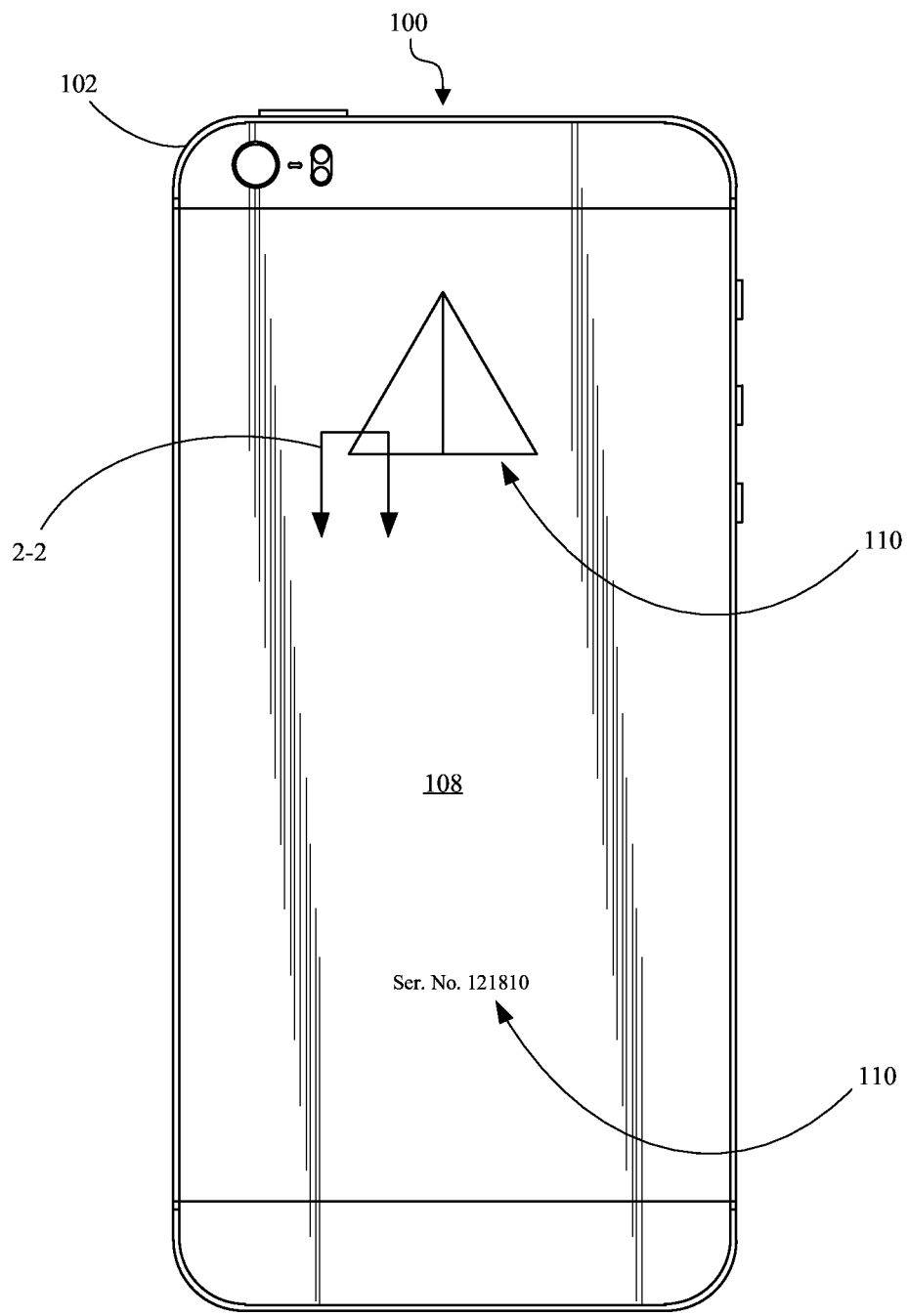
FIG. 1B depicts a back view of an electronic device including the ceramic-based housing, according to embodiments.

FIG. 1B depicts an illustrative back view of electronic device 100 of FIG. 1A, according to embodiments. Outer surface 108 of the back of electronic device 100 may include a plurality of markings 110. As shown in FIG. 1B, markings 110 may include a variety of glyphs. More specifically, markings 110 may include letters, numbers and/or logos formed on outer surface 108 of electronic device 100. Markings 110 may be formed on outer surface 108 of electronic device 100 to provide information relating to electronic device 100 to a user. In non-limiting examples as shown in FIG. 1B, marking 110 formed on outer surface 108 may include the logo for the electronic device 100, and/or marking 110 may include electronic device's 100 product identification or serial number. Additionally, marking 110 may include any other suitable logo, picture, graphic, decoration, pattern, product description or any other symbol or text (all of which are examples of markings) that may be included on electronic device 100. As discussed herein, marking 110 may be laser-etched directly into or on outer surface 108 of electronic device 100, to provide a color and/or optical contrast with outer surface 108, such that a user of electronic device 100 may clearly see markings 110.

Figure 2:
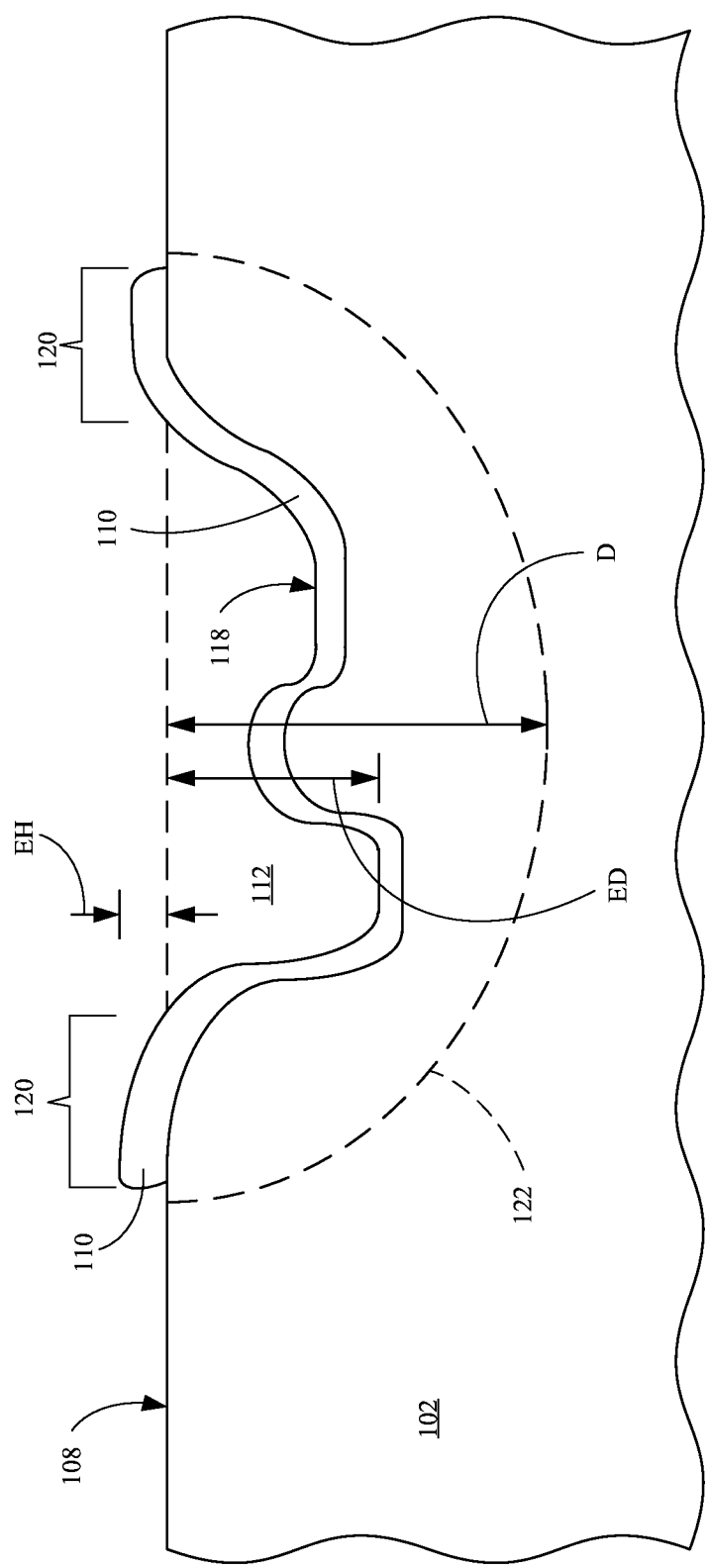
FIGS. 2-5 depict enlarged cross-section views of the ceramic-based housing of FIG. 1B taken along line 2-2, according to various embodiments.

Turning to FIG. 2, a cross-section view of electronic device 100 of FIG. 1B taken along line 2-2, is shown according to embodiments. Specifically, FIG. 2 shows an enlarged cross-section view of housing 102 of electronic device 100 including a portion of marking 110 formed in outer surface 108. As discussed herein, housing 102 of electronic device 100 may be formed from a ceramic-based material. In an non-limiting example, housing 102 may be formed from zirconia alumina.

Housing 102, and specifically, outer surface 108 of housing 102 may include a first color. More specifically, when viewed by a user of electronic device 100, outer surface 108 of housing 102 may include a first color based on the chemical composition of the ceramic-based material forming housing 102. The first color of housing 102 may not be a result of paint applied to outer surface 108. In a non-limiting example, the first color of outer surface 108 may not be a result of a paint layer applied to housing 102, but rather, may be a result of the formation and/or manufacturing of housing 102. In non-limiting examples, the first color of housing 102 and/or outer surface 108 may be or otherwise include black or white. As one example, the first color of housing 102 may be the dominant or majority color for electronic device 100.

As shown in FIG. 2 and discussed briefly above, marking 110 may be laser-etched on outer surface 108. In a non-limiting example, marking 110 may be formed on, in and/or substantially through outer surface 108, and may be positioned substantially in a portion of housing 102 of electronic device 100. As a result, and as discussed herein, marking 110 may be formed by removing a portion of the material forming housing 102 and/or marking 110 may include a recess 112 formed in housing 102.

Marking 110 may be formed on outer surface 108 of housing 102 using a laser etching process. In a non-limiting example, an ultraviolet laser etching process or an infrared laser etching processing may be performed on housing 102 to form marking 110 on outer surface 108. As discussed herein the laser etching process utilized to form marking 110 may substantially ablate and/or melt a portion of the ceramic-based material forming housing 102 and/or outer surface 108.

The laser etching process used to form marking 110 may also result in marking 110 formed on outer surface 108 to include a second color distinct from the first color of outer surface 108 and/or housing 102. That is, and as discussed in herein, the laser etching process may substantially change the physical and/or chemical properties of housing 102 in marking 110 such that marking 110 may include a second color that is distinct from the first color of housing 102 including outer surface 108. In a non-limiting example where housing 102 and/or outer surface 108 are substantially white in color, marking 110 formed on outer surface 108 using the laser etching process may be substantially black in color. In a further, non-limiting example, housing 102 and/or outer surface 108 may be black, marking 110 formed on outer surface 108 may be white. As a result of the color contrast between outer surface 108 and marking 110, marking 110 may form a variety of glyphs (e.g., logo, graphic, text, and so on) on outer surface 108 that may be visible to a user of electronic device 100, similar to that of marking 110 shown in FIG. 1B.

The operational perimeters and/or process of laser etching of marking 110 may be distinct and/or unique from other laser etching processes as a result of marking 110 being formed on a ceramic-based material. In a non-limiting example, because housing 102 is formed from a ceramic-based material (e.g., zirconia alumina), marking 110 may be formed on outer surface 108 with a ultraviolet or infrared laser having specific operational perimeters and/or specific procedures or steps. In addition, the operational perimeters and/or processes of laser etching marking 110 may also be dependent, at least in part, on the color of housing 102 and/or outer surface 108. These operational perimeters and/or processes performed during the laser etching of marking 110 on outer surface 108 may ensure marking 110 includes a color distinct from the color of outer surface 108 and/or housing 102, and/or marking 110 is visible to a user of electronic device 100 without the need of paint, as discussed herein.

In an non-limiting example where housing 102 is formed from a substantially white ceramic-based material, a diode-pumped, solid-state laser using Neodymium-doped Yttrium Orthovanadate ($Nd:YVO_4$) as a gain element may be utilized the form markings 110 on outer surface 108. In the non-limiting example, the laser may include the following operational perimeters: 355 nanometer (nm) laser wavelength, 20 nanosecond (ns) pulse width, 100 kilohertz (kHz) laser line width, 600 millimeter per second (mm/sec.) laser cutting speed, and 0.006 millimeter (mm) hatch distance. Additionally in the non-limiting example where housing 102 is formed from a white ceramic-based material, the laser may perform three (3) passes over outer surface 108 with the operational perimeters discussed above to form marking 110 including a substantially black color, which contrasts with the white ceramic-based material forming housing 102.

In another non-limiting example where housing 102 is formed from a substantially black ceramic-based material, a diode-pumped, solid-state laser using Neodymium-doped Yttrium Orthovanadate ($Nd:YVO_4$) as a gain element may include the following operational perimeters: 355 nm laser wavelength, 20 ns pulse width, 100 kHz laser line width, 550 mm/sec. laser cutting speed, and 0.002 mm hatch distance. Additionally in the non-limiting example where housing 102 is formed from a black ceramic-based material, the laser may perform between two (2) and ten (10) passes over outer surface 108 with the operational perimeters discussed above to form marking 110 including a substantially white color, which contrasts with the black ceramic-based material forming housing 102.

It is understood that the type of laser and operational perimeters of the laser used to form marking 110 may be merely exemplary. That is, the specific laser-type and operational perimeters discussed herein may be just some of the many lasers and/or operational perimeters that may be used to form marking 110 on outer surface 108 of housing 102, such that marking 110 and outer surface 108 include contrasting colors. Additionally, the number of passes the laser may make over outer surface 108 may also be merely exemplary. The number of passes may be any suitable number that may ensure marking 110 includes a color that substantially contrasts the color of the ceramic-based material forming housing 102, such that marking 110 is visible to a user of electronic device 100.

As shown in FIG. 2, marking 110 may form a recess 112 in outer surface 108. Laser-etched marking 110 may form recess 112 through outer surface 108 and into a portion of housing 102 of electronic device 100 (see, FIGS. 1A and 1B). Recess 112 of marking 110 may be formed in outer surface 108 of housing 102 using the laser etching process, as discussed herein. In a non-limiting example, a laser may ablate and/or melt a portion of the ceramic-based material forming housing 102 at outer surface 108, and may form recess 112 extending into a portion of housing 102.

Recess 112 of marking 110, as shown in FIG. 2, may include a substantially uneven surface 118 formed during the laser etching process. As a result of forming substantially uneven surface 118, recess 112 of marking 110 may include substantially varied etch depths (ED) within housing 102. The etch depth (ED) may be the distance recess 112 is formed below outer surface 108. In non-limiting examples, recess 112 formed in outer surface 108 may include an etch depth (ED) between approximately 2 micrometers (μm) and approximately 8 μm. The etch depth (ED) of recess 112, as shown in FIG. 2, may be dependent, at least in part, on the color of the ceramic-based material forming housing 102, and the operational perimeters of the laser used to form recess 112.

Marking 110 may also form a raised portion 120 that may substantially surround recess 112 formed in housing 102. In a non-limiting example shown in FIG. 2, marking 110 may include raised portion 120 formed on either side of recess 112, where raised portion 120 of marking 110 may be positioned above outer surface 108 of housing 102. Raised portion 120 may be formed during the laser etching process used to form marking 110 on outer surface 108, as discussed herein. In the non-limiting example, the ablation and/or melting of the ceramic-based material forming housing 102 to form marking 110 may result in a collection of ceramic-based material (e.g., raised portion 120) that may not be completely removed from housing 102. This collection of ceramic-based material may be melted during the laser etching process, but may not be ablated and/or removed. As a result, the previously melted collection of ceramic-based material may harden on and/or above outer surface 108 and may form raised portion 120 of marking 110. The formation of raised portion 120 of marking 110 above outer surface 108 may be dependent upon the amount of ceramic-based material that is ablated and/or melted from housing 102 when forming marking 110. As such, the dimensions and/or the etch height (EH) of raised portion 120 positioned above outer surface 108 may vary. In non-limiting examples, raised portion 120 of marking 110 may be positioned above outer surface 108, and include an etch height (EH) between approximately 1.4 μm and approximately 2.5 μm.

Housing 102 may include a heat affected region (HAR) 122, shown in phantom. In a non-limiting example shown in FIG. 2, housing 102 may include HAR 122 positioned adjacent to and/or substantially surrounding marking 110 formed in housing 102. Additionally, HAR 122 may be positioned substantially below outer surface 108 of housing 102. HAR 122 may be positioned below outer surface 108 by a distance (D) dependent, at least in part, on: the material composition of the ceramic-based material forming housing 102, the color of the ceramic-based material forming housing 102, the operational perimeters of the laser used in the laser etching process for forming marking 110, and the etch depth (ED) of recess 112 in housing 102. In non-limiting examples, HAR 122 may be positioned below outer surface 108 of housing 102 a distance (D) of approximately, 5 μm and approximately 14 μm.

HAR 122 may be formed during the laser etching processes performed on housing 102 to form marking 110. That is, HAR 122 may include a portion or region of the ceramic-based material forming housing 102 that may be affected by the laser and the laser etching process performed on housing 102 and/or outer surface 108 to form marking 110. HAR 122 may include a region or portion of the ceramic-based material forming housing 102 that may be heated by the laser used in the laser etching process forming marking 110, but the ceramic-based material in HAR 122 may not be ablated and/or melted. As discussed herein, the laser etching process may affect HAR 122 by changing and/or altering the chemical composition of the ceramic-based material included in HAR 122 when compared to the remainder of the material in housing 102 and/or outer surface 108.

Although shown to include a substantially uniform, geometric shape (e.g., semi-circular), it is understood that HAR 122 may include a substantially non-uniform region or portion of the ceramic-based material forming housing 102 that may be affected by the laser etching process. HAR 122 shown in FIG. 2 as being semi-circular is merely exemplary, and may only be depicted as being semi-circular to show how HAR 122 is generally formed within housing 102 as a result of the laser etching process. In another non-limiting example, HAR 122 may take a similar shape corresponding to the shape of recess 112 formed in housing 102.

As briefly mentioned above, the laser etching process performed on housing 102 and/or outer surface 108 to form marking 110 may alter the chemical composition of marking 110 and HAR 122. In a non-limiting example, the ablation and/or melting of a portion of the ceramic-based material of housing 102 to form marking 110 and HAR 122 may also change the chemical composition of the material formed within marking 110 and HAR 122. In the non-limiting example where housing 102 of electronic device 100 is formed from white (e.g., color) zirconia alumina ($ZrO_2Al_2O_3$), the ablating and/or melting of the material to form marking 110 may change the chemical composition of marking 110 and HAR 122 from zirconia alumina. In the non-limiting example, marking 110 may be formed from a resolidified portion of the material forming housing 102 that has been melted, but not ablated from recess 112. The resolidified portion of material forming marking 110 may primarily include zirconia ($ZrO_2$), with a small percentage-by-weight of aluminum (Al) and carbon (C). The material forming marking 110 may include a loss of oxygen (O) during the laser etching process, and specifically, when melting the zirconia alumina to forming marking 110.

Additionally in the non-limiting example, portions of the material included in the HAR 122 may also include chemical composition changes or alterations. In a non-limiting example, some portions of the material affected by the laser etching process, and specifically the heat of the laser used to ablate and/or melt the material, may primarily include zirconia ($ZrO_2$) as well. However, these portions of material included in the HAR 122, when compared to the material of marking 110, include more oxygen (O) and aluminum (Al), and approximately the same amount of carbon (C). Distinct portions of material in HAR 122 may primarily include Alumina ($Al_2O_3$), with a small percentage-by-weight of carbon (C). These chemical composition changes or alterations, in conjunction with the change in the optically reflective properties of marking 110 as discussed herein, may form the contrast in colors between outer surface 108 of housing 102 and marking 110 formed therein.

Figure 3:
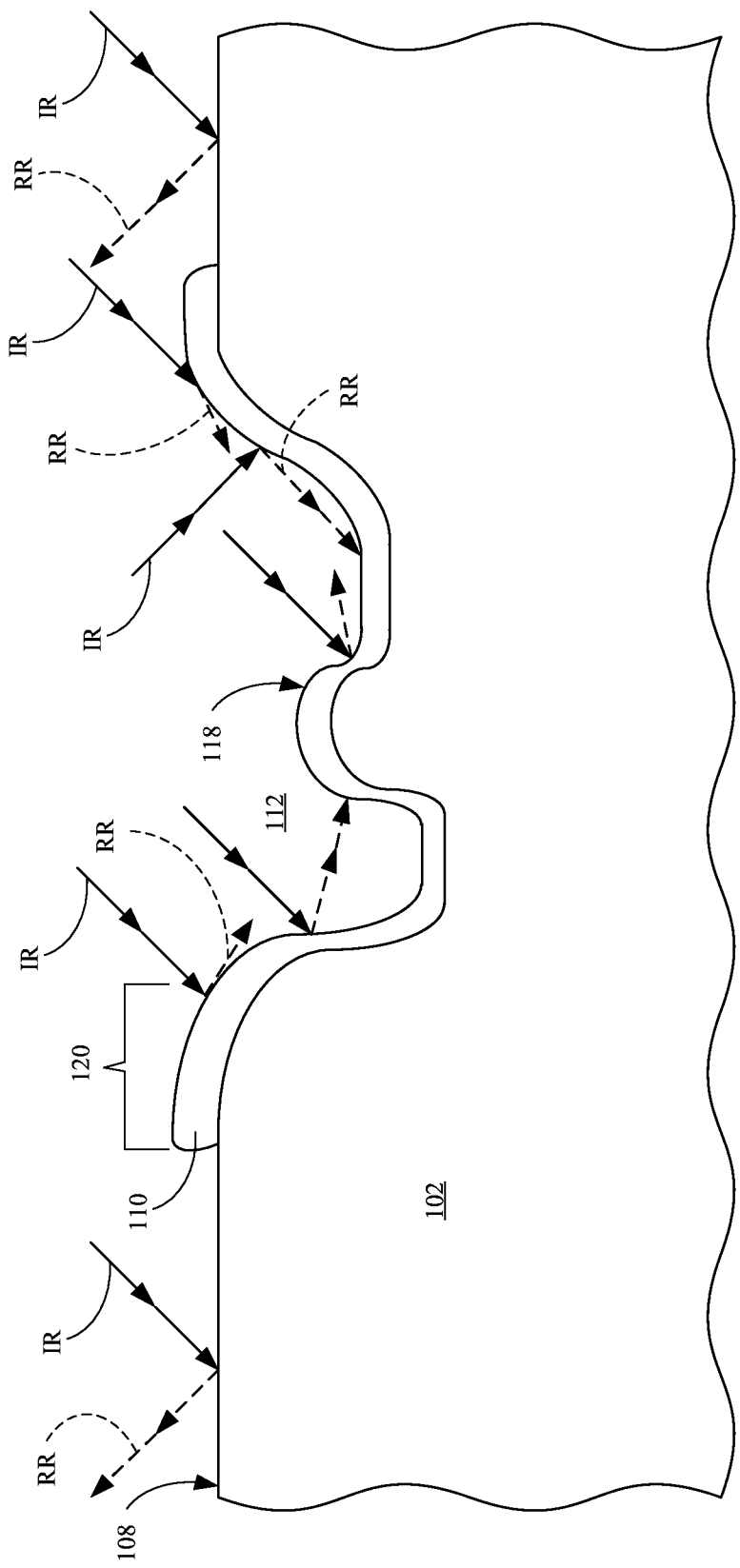

FIG. 3 shows an enlarged cross-section view of housing 102 of electronic device 100 including a portion of marking 110 formed in outer surface 108, as similarly discussed herein with respect to FIGS. 1 and 2. More specifically, FIG.

3 shows how light-rays interact and/or reflect off of outer surface 108 of housing 102 and marking 110 formed on outer surface 108 during use of electronic device 100. It is understood that similarly numbered components may function in a substantially similar fashion. Redundant explanation of these components has been omitted for clarity.

As shown in FIG. 3, incident rays (IR) of light may be directed toward housing 102 of electronic device 100. The provided incident rays (IR) may contact a surface (e.g., outer surface 108, uneven surface 118) and may subsequently be reflected, producing reflected rays (RR)(shown in phantom). The path of reflected rays (RR) reflecting off of housing 102, in conjunction with the material composition of housing 102, may directly affected the perceived color of housing 102 by a user of electronic device 100. In the non-limiting example discussed above where housing 102 is formed from white zirconia alumina ($ZrO_2Al_2O_3$), outer surface 108 of housing 102 may appear to be white, as a result of the path of reflected rays (RR). As shown in FIG. 3, the angle at which the incident rays (IR) are directed toward outer surface 108 is substantially equal to the angle at which the reflected rays (RR) are directed away from outer surface 108. As such, outer surface 108 may substantially reflect and/or not affect the color (e.g., white) of housing 102.

As shown in FIG. 3, the incident rays (IR) that are directed toward uneven surface 118 of marking 110 may include the same angle as the incident rays (IR) directed toward outer surface 108. However, as shown in FIG. 3, reflected rays (RR) reflected from uneven surface 118 of marking 110 may not include a similar angle as the incident rays (IR) provided to uneven surface 118. In the non-limiting example, the angle and/or path in which the reflected rays (RR) may be reflected is distinct, based on the angle and/or position of uneven surface 118 of marking 110. The reflected rays (RR) reflecting from uneven surface 118 of marking 110 may be reflected in non-uniform or scattered angles or paths, as a result of marking 110 including non-planar, uneven surface 118. The non-uniform and/or scattered reflected rays (RR) reflecting from uneven surface 118 of marking 110 may affect the color of marking 110 viewed by a user of electronic device 100. More specifically, because reflected rays (RR) are reflected in a scattered pattern as a result of uneven surface 118, marking 110 may appear to have a contrasting dark, or black color when viewed by a user of electronic device.

As a result of the foregoing and/or as a result of contrasting colors due to the reflective properties of outer surface 108 and/or uneven surface 118, marking 110 may be formed on housing 102 of electronic device 100 to provide a visible glyph or design, without the need of paint, or the process of painting housing 102.

Figure 4:
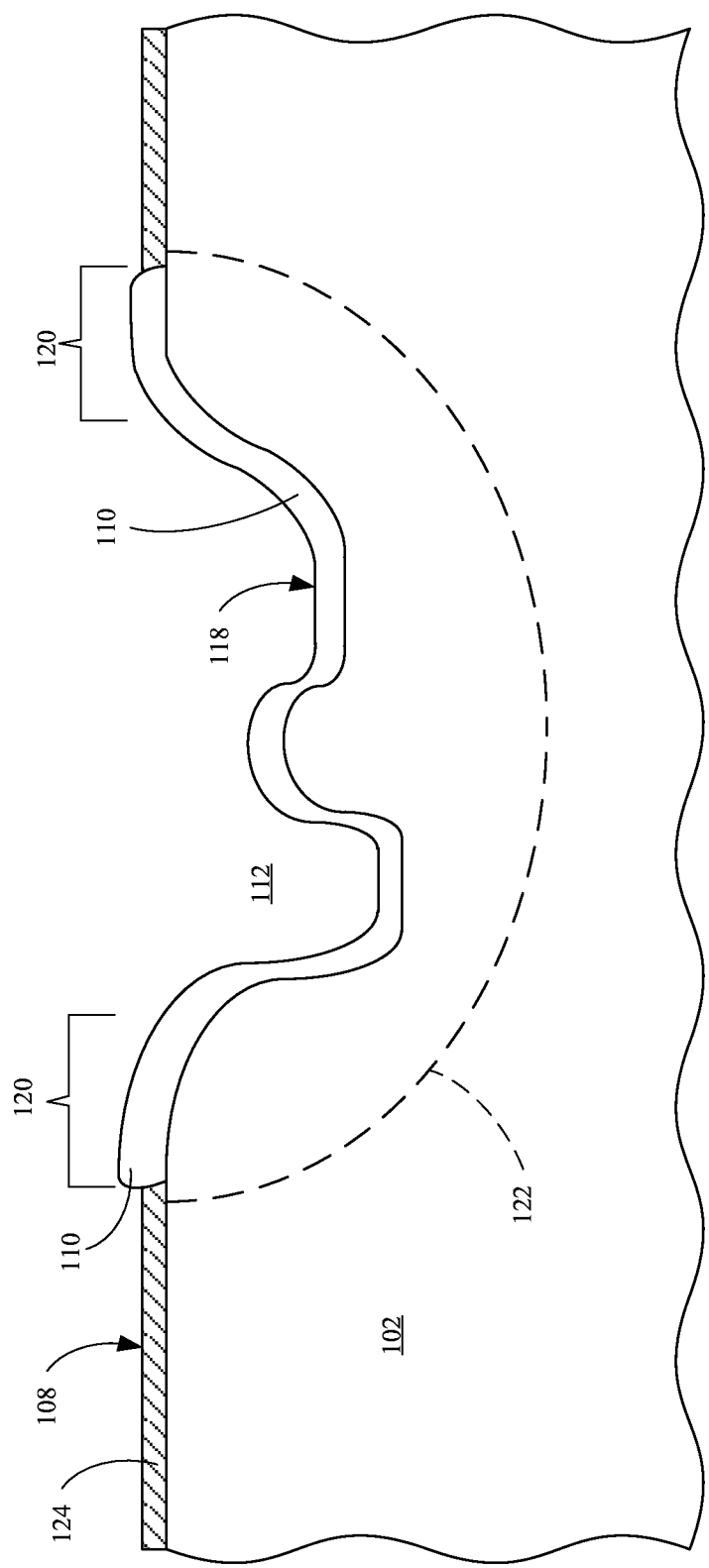

FIG. 4 shows an enlarged cross-section view of housing 102 of electronic device 100 including a portion of marking 110 formed in outer surface 108, as similarly discussed herein with respect to FIG. 2. As shown in FIG. 4, outer surface 108 of housing 102 may be substantially annealed. In a non-limiting example, outer surface 108 of housing 102 may undergo an annealing process to form a substantially annealed portion 124 of the ceramic-based material forming housing 102 on outer surface 108. By annealing outer surface 108 and/or housing 102, annealed portion 124 may be reflowed, and/or may include a portion of ceramic-based material forming housing 102 that may be partially melted and then subsequently resolidified to form a polished and/or substantially planar outer surface. As discussed herein, the polished and/or planar outer surface of housing 102 may ensure housing 102 will include a desired color visible by the user of electronic device 100.

Figure 5:
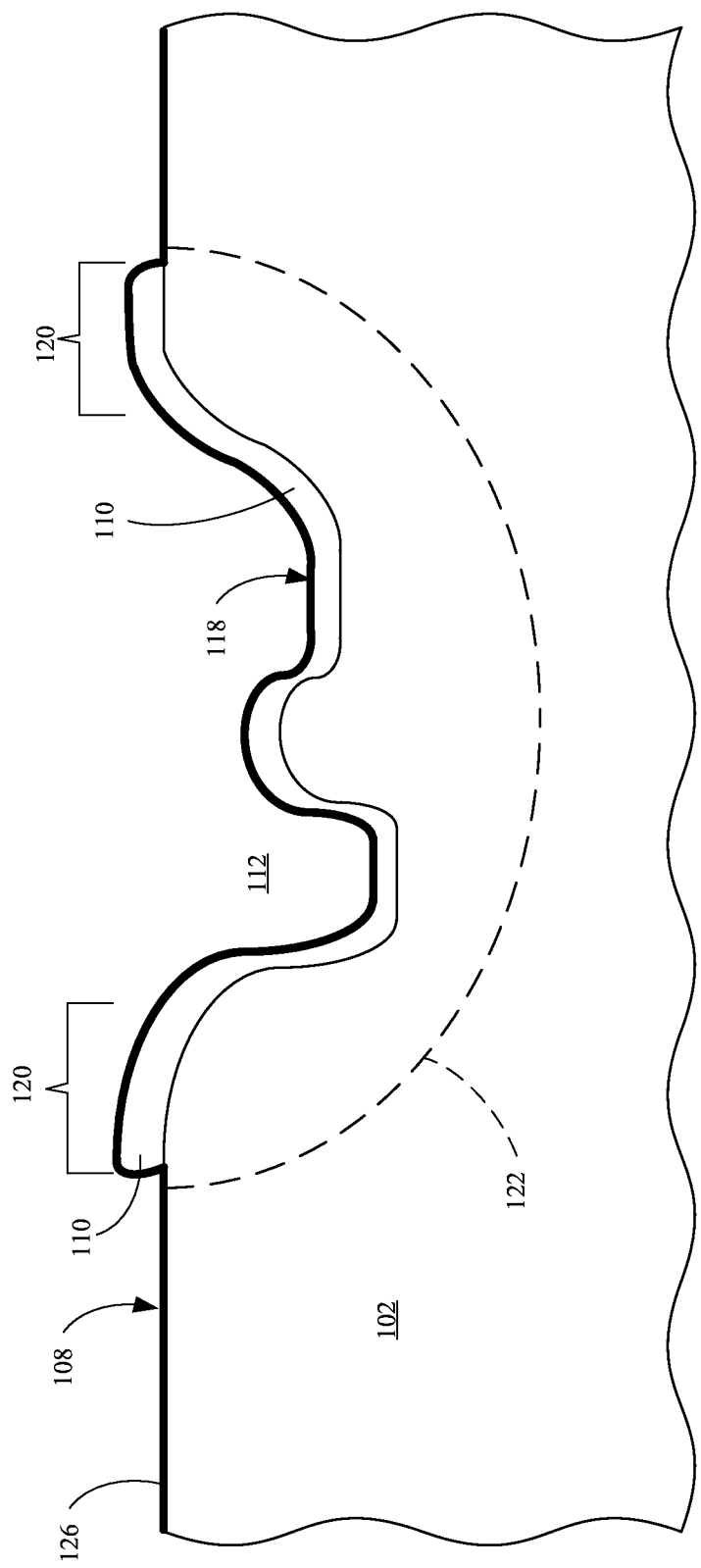

FIG. 5 may also show an enlarged cross-section view of housing 102 of electronic device 100 including a portion of marking 110 formed in outer surface 108, as similarly discussed herein with respect to FIG. 2. As shown in FIG. 5, both outer surface 108 and uneven surface 118 may include a reflective layer 126. In a non-limiting example, reflective layer 126 may cover and/or may be formed over both outer surface 108 of housing 102 and uneven surface 118 of marking 110. Reflective layer 126 may be formed over the respective surfaces of housing 102 to increase the reflective properties of the surfaces, as discussed herein with respect to FIG. 3, to ensure a user views outer surface 108 as a desired color (e.g., white). Additionally, reflective layer 126 may be formed over uneven surface 118 of marking 110 to increase the reflective properties to ensure a user views marking 110 as a desired color (e.g., black) that is distinct from the color of outer surface 108 of housing 102. Reflective layer 126 may include any suitable material that may increase the reflective properties of the surfaces of housing 102. In a non-limiting example, reflective layer 126 may be formed from a paint including substantially reflective properties.

Figure 6:
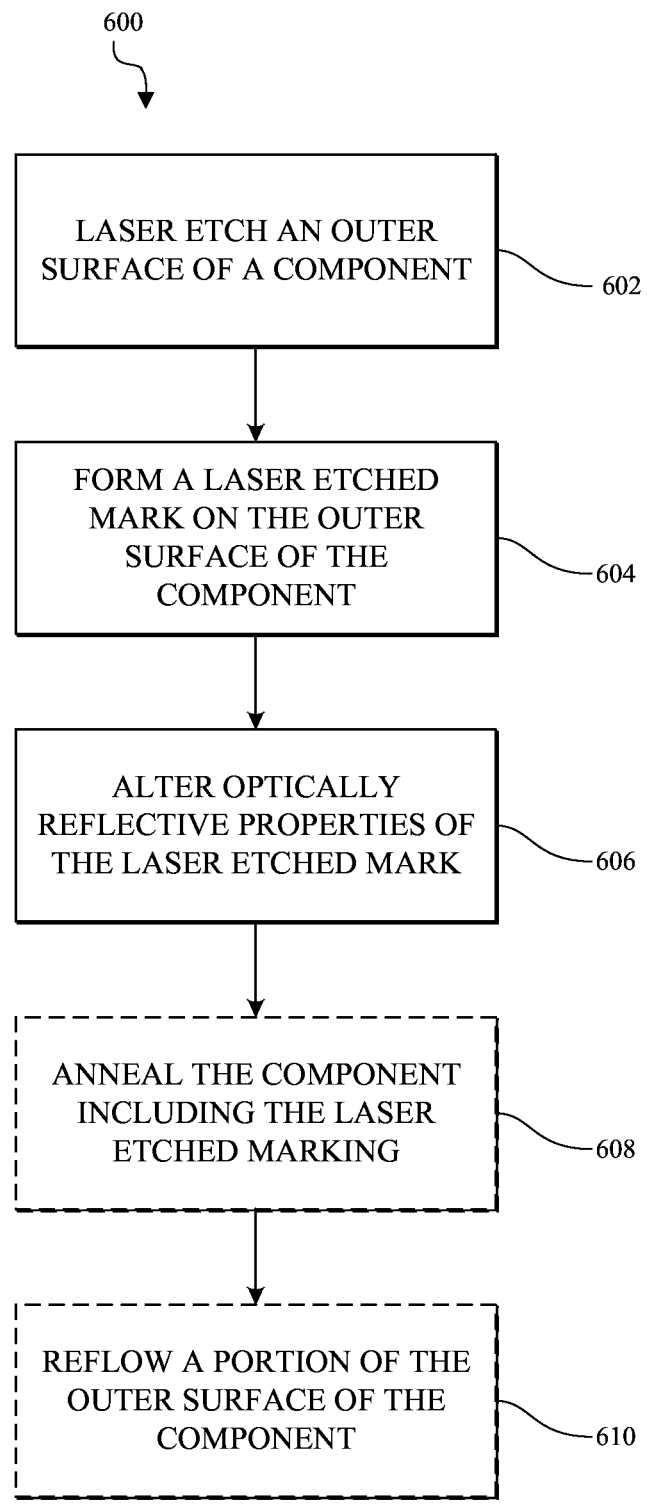
FIG. 6 depicts a flow chart of an example process for forming a ceramic-based component of an electronic device, according to embodiments.

FIG. 6 depicts an example process for forming a ceramic-based component for an electronic device. Specifically, FIG. 6 is a flowchart depicting one example process 600 for forming a ceramic-based housing for an electronic device, as discussed above with respect to FIGS. 1A-5.

In operation 602, an outer surface of ceramic-based component may be laser-etched. More specifically, a laser etching process may be performed on the outer surface of the ceramic-based component to substantially ablate a portion of the ceramic-based component and/or melt a portion of the ceramic-based component. The laser etching process performed on the outer surface of the ceramic-based component may include performing an ultraviolet laser etching process or performing an infrared laser etching process. The laser etching process performed in operation 602 may also include performing a plurality of passes over the outer surface of the ceramic-based component with the laser. That is, the laser performing the laser etching process may pass over substantially the same portion of the ceramic-based component multiple times when performing the laser etch.

In operation 604, a laser-etched marking may be formed on the outer surface of the ceramic-based component. In response to performing the laser etching process, a marking may be formed on the outer surface of the ceramic-based component. The formation of the laser-etched marking may also include forming a recess in the outer surface of the ceramic-based component. The recess may include a substantially non-planar, uneven surface. When performing the laser etching process and/or forming the laser-etched marking and/or recess on the outer surface of the ceramic-based component, the chemical composition of the component may be altered. That is, the formation of the marking and/or the recess may result in an alteration of the chemical composition of a portion of the ceramic-based component included within the recess. The chemical composition of the material included within the recess may be distinct from the chemical composition of the material forming the remainder of the ceramic-based component.

In operation 606, the optically reflective properties of the material included in the marking may be altered. That is, in response to performing the laser etching process to form the marking, the optical reflective properties of the material included in the marking may be altered, affected and/or changed. As a result, the marking may appear to be a distinct color than the rest of the ceramic-based component.

In optional operation 608, shown in phantom, the ceramic-based component including the laser-etched marking may be annealed. More specifically, the ceramic-based component including the recess of the marking formed on the outer surface of the component may be annealed to at least alter the state of a portion of the material forming the component. As a result of the chemical composition change within the material included in the recess of the laser-etched marking in operation 604, the material forming the marking may not be affected during the annealing process.

In optional operation 610, shown in phantom, a portion of the material included in the outer surface of the ceramic-based component may be reflowed. More specifically, a portion of the material of the annealed ceramic-based component may be reflowed to form a substantially planar, polished outer surface of the component. The ceramic-based component may be annealed in operation 608, to reflow a portion of the material on the outer surface to substantially enhance the color contrast between the outer surface and the laser-etched marking. When the outer surface includes a reflowed portion of material that may form a substantially planar, polished outer surface, the ceramic-based component, excluding the marking, may include a single color visible by the user. The reflowing may ensure the outer surface includes the single color of the ceramic-based component that is distinct from the color of the marking formed using the laser etching process in operation 602.

Although not shown, an additional operation may include applying a reflective layer to ceramic-based component. The reflective layer may be applied to the outer surface of the ceramic-based component, and the substantially non-planar, uneven surface of the recess of the laser-etched marking. The reflective layer may be applied to the surfaces of the ceramic-based component to substantially enhance the optically reflective properties of different surfaces of the component. By enhancing the reflective properties of the layers of the ceramic-based component, the reflective layer may ensure that the outer surface of the component includes or provides a first visible color to a user, while the laser-etched marking provides a second visible color to the user distinct form the first color.

Although a ceramic-based component is discussed herein to include a marking having a contrasting color with the color of the component, it is understood that other effects and/or visual characteristics may be created on the ceramic-based component using the laser etching process. That is, the laser etching process discussed herein may be used to lighten, darken and/or polish at least a portion of an outer surface of a ceramic-based component to produce a desired cosmetic effect on the outer surface of the component. In a non-limiting example, the recess formed in ceramic-based component as discussed above, may be substantially shallow, and may be darkened (e.g., color change). In this example, the recess may not be deep enough to form a marking on the ceramic-based component as discussed above, but rather, may provide a shadow effect on the outer surface of the component. This shadow effect may be used in conjunction with markings formed on the component or other features of the component to provide a desired cosmetic effect.

In addition, the lightening, darkening and/or polishing, as discussed herein, may be used on a plurality of surface and/or components to produce a desired cosmetic effect. In addition to performing the processes as discussed herein on a substantially planar outer surface of a ceramic-based component, the processes may be performed on protrusions, seams, chamfers and/or any other suitable shape, component or configuration of an electronic device to provide desired cosmetic effects.

As discussed herein the laser etching process may include ablating and/or melting a portion of the material included in the ceramic-based component. In addition, the laser etching process and/or the process of forming the recess within the component may include knurling, forming, machining, drilling and/or any other suitable material removal process. Furthermore, the marking may be formed without the need of masking, or may be formed on a part that has been anodized or includes an oxide layer. When forming the marking on the anodized component, the marking may be formed through the oxide layer as well.

The process of laser etching the marking on the outer surface of the ceramic-based component may result in the formation of a recess in the ceramic-based component and, a contrast in colors between the outer surface and the laser-etched marking or recess. More specifically, the process of ablating and melting a portion of the ceramic-based component during a laser etching process may result in a color/optical contrast between the laser-etched portion (e.g., marking or recess) and the unaffected, outer surface of the ceramic-based component. The color/optical contrast may be formed as a result of the way light interacts with and/or reflects from the outer surface of the ceramic-based component, in contrast to the uneven, laser-etched marking or recess formed in the ceramic-based component. By forming a color contrast between the outer surface of the ceramic-based component and the marking or recess formed on the surface of the ceramic-based component, the need for painting a design, text or logo on the component may be unnecessary. As such, the manufacturing time and/or cost of forming a ceramic-based component for an electronic device may be reduced. Furthermore, the marking formed on the surface of the ceramic-based component may be substantially permanent, and may not wear off, distort and/or fade over the life of the electronic device.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

We claim:

1. A ceramic-based housing for an electronic device, comprising:
   a component formed from a ceramic material and defining an outer surface, the ceramic material comprising a first ratio of zirconium to aluminum;
   a laser-etched blind recess formed into the component by ablating the ceramic material and defining at least a portion of a glyph; and
   a marking defined by a bottom surface of the laser-etched blind recess and a raised portion extending above the outer surface and surrounding the laser-etched blind recess, the marking having an altered material composition of the ceramic material resulting from a melting and resolidification of the ceramic material, the marking having a second ratio of zirconium to aluminum, the second ratio different from the first ratio, and being optically distinct from a portion of the outer surface adjacent the marking, wherein the portion of the outer surface of the ceramic material adjacent the marking is defined by an unaltered material composition of the ceramic material.

2. The ceramic-based housing of claim 1, wherein the outer surface comprises a first color that is one of black or white.

3. The ceramic-based housing of claim 2, wherein the laser-etched blind recess comprises a second color that is one of black or white, distinct from the first color.

4. The ceramic-based housing of claim 1, further comprising a heat affected region positioned adjacent to the laser-etched blind recess, the heat affected region positioned below the outer surface.

5. A ceramic-based housing for an electronic device, comprising:
a ceramic component defining:
an exterior surface comprising a first ceramic material having a first group of constituent material elements including zirconium and aluminum in a first ratio to one another;
a blind recess within the ceramic component; and
a marking defined by a surface of the blind recess and a raised feature surrounding the blind recess, the marking:
comprising a second ceramic material having a second group of constituent material elements including zirconium and aluminum in a second ratio to one another, the second ratio different from the first ratio;
formed from a resolidified portion of the second ceramic material that is melted when the ceramic component is ablated;
exhibiting an optical contrast with respect to the exterior surface; and
defining at least a portion of a glyph.

6. The ceramic-based housing of claim 5, wherein the surface of the blind recess is an uneven surface that non-uniformly reflects incident light.

7. The ceramic-based housing of claim 5, wherein the surface of the blind recess has a different color than the exterior surface.

8. The ceramic-based housing of claim 5, wherein the exterior surface is at least partially formed via an annealing process that reflows a portion of the exterior surface to form a planar, polished first surface.

9. The ceramic-based housing of claim 5, further comprising a reflective coating on at least one of the exterior surface or the surface of the blind recess.

10. An electronic device, comprising:
a housing component having a first ceramic composition having a first ratio of zirconium to aluminum, the housing component defining:
a surface; and
a marking defined by:
a laser-ablated groove formed into the housing component along the surface; and
a raised rim surrounding the laser-ablated groove, the raised rim and a surface of the laser-ablated groove formed of a second ceramic composition formed as a result of the laser ablation, the second ceramic composition having a second ratio of zirconium to aluminum, the second ratio different than the first ratio,
wherein the marking defines an exterior surface of the housing component that is optically contrasting with respect to a remainder of the surface having the first ceramic composition; and
a display at least partially positioned within the housing component.

11. The electronic device of claim 10, wherein the optical contrast is due, at least in part, to the second ceramic composition having a different ratio of zirconium to aluminum.

12. The electronic device of claim 10, wherein the optical contrast is due, at least in part, to a non-uniformity of the marking.

13. The ceramic-based housing of claim 1, wherein the laser-etched blind recess extends into the outer surface by less than 8 microns.

14. The ceramic-based housing of claim 1, wherein:
the ceramic material is zirconia alumina.

15. The electronic device of claim 10, wherein:
the first ceramic composition corresponds to a zirconia alumina ceramic; and
the second ceramic composition corresponds to a zirconia ceramic.

16. The ceramic-based housing of claim 4, wherein the heat affected region is positioned below the outer surface by a distance between approximately 5 microns and approximately 14 microns.

17. The ceramic-based housing of claim 5, wherein the ablating is performed with a laser having an ultraviolet wavelength.

18. The electronic device of claim 10, wherein the laser-ablated groove is formed by a laser having operational parameters comprising:
a laser wavelength of 355 nm; and
a pulse width of 20 ns.

19. The electronic device of claim 10, wherein a height of the raised rim surrounding the laser-ablated groove above the surface is between approximately 1.4 microns and approximately 2.5 microns.

20. The ceramic-based housing of claim 5, wherein:
a depth of the blind recess below the exterior surface of the ceramic component is between 2 microns and 8 microns; and
a height of the raised feature above the exterior surface of the ceramic component is between 1.4 microns and 2.5 microns.

* * * * *